United States Patent [19]

Bess et al.

[11] Patent Number: 5,208,976
[45] Date of Patent: May 11, 1993

[54] APPARATUS AND METHOD FOR ASSEMBLING CIRCUIT STRUCTURES

[75] Inventors: Charles G. Bess, Little Rock; Walter W. Jones, Jr.; Edward E. Lewis, both of Benton, all of Ark.

[73] Assignee: AT&T Bell Laboratories, Murray Hill, N.J.

[21] Appl. No.: 710,631

[22] Filed: Jun. 5, 1991

[51] Int. Cl.$^5$ .............................................. H05K 3/30
[52] U.S. Cl. ...................................... 29/837; 29/702; 29/740
[58] Field of Search ................ 29/741, 840, 740, 832, 29/837, 702

[56] References Cited

U.S. PATENT DOCUMENTS

| | | | |
|---|---|---|---|
| 4,202,092 | 5/1980 | Shibasaki et al. | 29/741 |
| 4,459,743 | 7/1984 | Watanabe et al. | 29/84 U X |
| 4,586,151 | 4/1986 | Buote | 364/513 |
| 4,680,519 | 7/1987 | Chand et al. | 318/568 |
| 4,704,792 | 11/1987 | Itagaki et al. | 29/741 |
| 4,705,081 | 11/1987 | Birk et al. | 29/741 X |
| 4,819,699 | 4/1989 | Brown et al. | 29/741 X |
| 4,831,582 | 5/1989 | Miller et al. | 364/900 |
| 4,841,450 | 6/1989 | Fredriksson | 364/468 |
| 4,868,979 | 9/1989 | Fukushima et al. | 29/840 |
| 4,964,062 | 10/1990 | Ubhayakar | 364/513 |
| 5,007,162 | 4/1991 | Weeber | 29/740 X |
| 5,017,809 | 5/1991 | Turner | 307/465 |

FOREIGN PATENT DOCUMENTS 3502297 7/1986 Fed. Rep. of Germany ........ 29/741

OTHER PUBLICATIONS

Technica 39(7) pp. 17–21, Apr. 1990 by G. Gruhle, et al.

Primary Examiner—Timothy V. Eley
Attorney, Agent, or Firm—D. A. Marshall

[57] ABSTRACT

Apparatus and method for assembling circuit structures in an assembly line process. The apparatus responds to a set of program instructions by selecting components in a predefined sequence from a plurality of components and aligns each selected component to correspond with an orientation defined by the program instruction set required to mount the selected component at a specific location on a circuit board. The apparatus is controlled by the program instruction set to electrically configure and program each selected and aligned component in real-time in accordance with a configuring and programming subset of the program instruction set and to install each configured component at a predefined circuit board location.

19 Claims, 6 Drawing Sheets

117XX

5,208,976

APPARATUS AND METHOD FOR ASSEMBLING CIRCUIT STRUCTURES

TECHNICAL FIELD

The invention relates to apparatus and method for assembling circuit structures and in particular to assembling circuit structures in a continuous assembly process.

BACKGROUND AND PROBLEM

In manufacturing operations, electronic apparatus may be constructed of circuit structures, such as circuit boards, which are individually assembled and then interconnected to fabricate the electronic apparatus. Such circuit structures usually consist of components mounted on conductor pads formed on a circuit board and which are interconnected by electrical conducting paths to control operation of the components to perform functions for which the circuit structures were designed. Circuit structures used in electronic apparatus, such as computers, are assembled with components mounted on circuit boards. Typical components, among others, include logic gate and element arrays, microprocessor and memory devices.

Each one of the logic gate and element arrays, microprocessors and memory devices must be uniquely configured for each circuit board application in order that the circuit board may perform the intended operational functions of the circuit structure. For example, a logic gate array may have a larger number of NOR and AND digital gates connected to terminals of the array thereby enabling the gate array to be used in a wide number of circuit structure applications. However, the gate array may be required to be configured for a specific circuit structure application where only certain NOR and AND digital gates will be required. Remaining ones of the NOR and AND digital gates must be disconnected from the array terminals or rendered inoperative in order that the gate array may be used in the specific circuit structure application. An element array may have a large number of series or parallel resistor or capacitor elements which must be configured by disconnecting ones of the resistors or capacitors from the array terminals in order that the element array may be used in a specific circuit structure application. Memory devices are required to be configured in size to meet certain circuit structure applications and both microprocessor and memory devices may be required to be configured by programming the devices with firmware program instructions that control operation of the circuit structure.

Presently, components are configured for a specific circuit structure at a time prior to assembly of the circuit structure and placed in reels or storage devices which are subsequently located at an assembly line in order that the components may be removed from the reels and storage devices and mounted on a circuit board. In the assembly of circuit structures, it is desirable that a number of different types of circuit structures be assembled on a single assembly line in a continuous operation and that the configuration of components be coordinated with the assembly process so that each component is uniquely configured and programmed for each type of circuit structure at the time the circuit structure is being assembled. A problem arises in that components are configured and programmed for a specific circuit structure prior to the time that the circuit structure is assembled. Another problem arises in that a circuit structure assembly line must be changed to add and delete component reels and storage devices when one type of circuit structure is replaced by another type of circuit structure. Yet still another problem arises in that it is necessary to stop the circuit structure assembly line and replace ones of the microprocessor, memory reels and storage devices when it becomes necessary to replace firmware program instructions stored in a microprocessor or a memory component with a later version of the component programmed with new firmware instructions.

SOLUTION

The foregoing problems are solved by apparatus and a method of operation arranged for assembling circuit structures by configuring and programming components and assembling the configured and programmed components on circuit board in a continuous assembly process. In an exemplary embodiment of the invention, apparatus responds to a set of program instructions by controlling a robotic structure to select components from a plurality of components and align each selected component to correspond with an orientation defined by the program instruction set required to mount the selected component at a specific location on a circuit board. The apparatus is controlled by the program instruction set during a continuous operation of the assembly process for electrically configuring and programming each selected and aligned component in accordance with a subset of the program instructions and installing each configured and programmed component at a predefined circuit board location to assemble the circuit structures.

DETAILED DESCRIPTION

Figure 1:
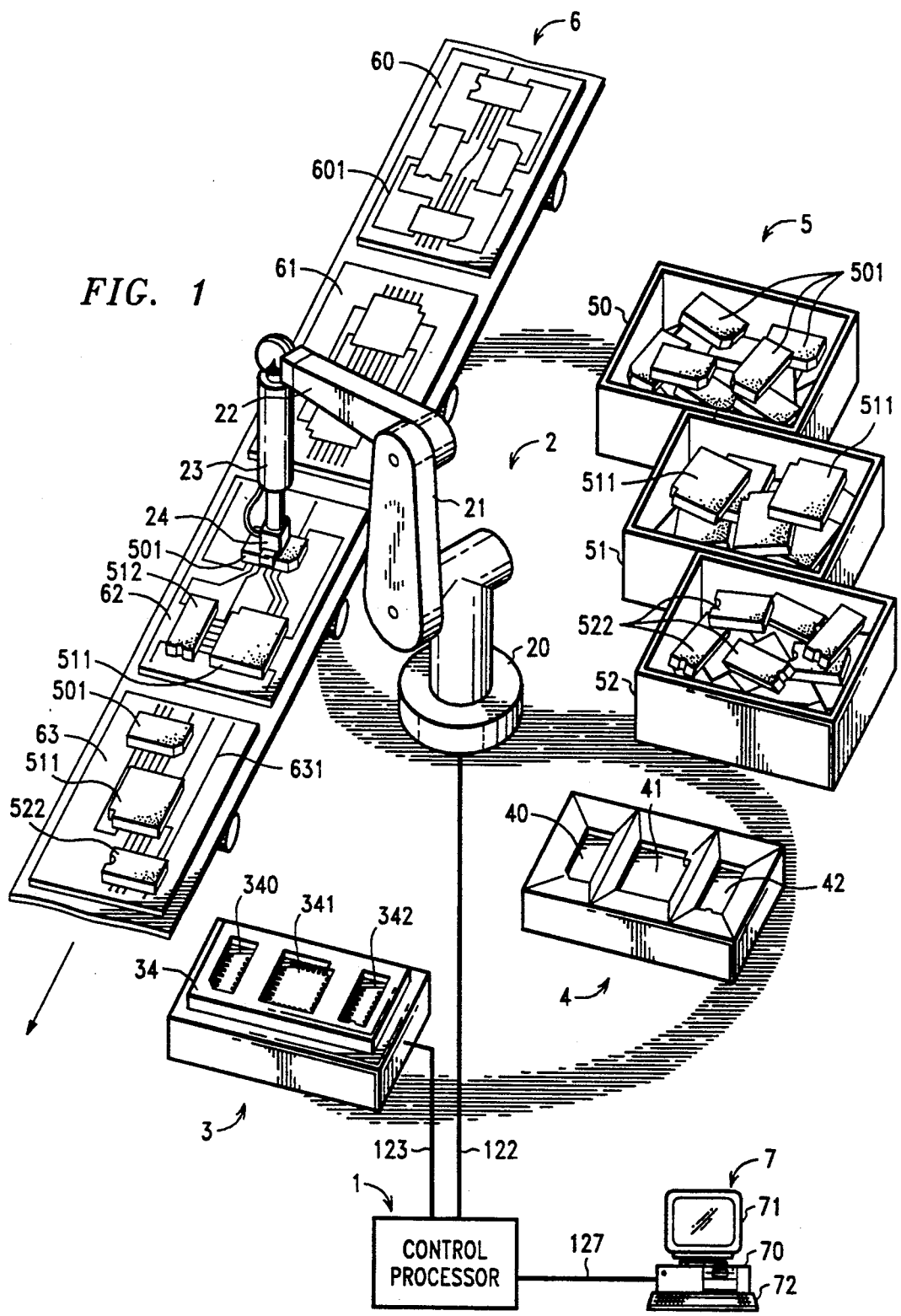
FIG. 1 sets forth apparatus for assembling circuit structures by configuring, programming and mounting components on circuit boards in accordance with the principles of the invention.

In an exemplary embodiment of the invention, the apparatus set forth in FIG. 1 of the drawing is intended for use in a continuous assembly process wherein a set of program instructions stored in control processor 1 controls apparatus to assemble circuit structures by selectively mounting configured and programmed components, such as components 501, 511 and 522, onto circuit boards 60 through 63. The apparatus responds to control processor 1 by selecting components 501, 511 and 522 in a predefined sequence from component storage devices 50, 51 and 52 or reels of components and aligning each selected component to correspond with an orientation defined by assembling circuit structures program 100, FIG. 2, hereinafter referred to as program instruction set 100, required to mount the selected component at a specific location on one of circuit boards 60, 61, 62 and 63. Control processor 1 is controlled by stored program instruction set 100 to electrically configure and program each selected and aligned logic component in accordance with a subset of the program instructions 100 and to install each configured and programmed logic component, FIG. 1, at a predefined location on circuit boards 60, 61, 62 and 63.

The apparatus may include an assembly line unit, not shown in detail, and which is configured in the well-known manner used in manufacturing operations, to receive and hold circuit boards 60, 61, 62, 63 while the apparatus of the invention selectively mounts components 501, 511, 522 on the boards during assembly of circuit structures.

Components may be any of a number of different types and styles which are well-known and need not be described in detail for an understanding of the invention. Sufficient to say that one component, such as component 501, may have a generally rectangular configuration wherein terminals intended for use in surface mounting component 501 on a circuit board are embodied along bottom edges of component 501. In the instant embodiment of the invention, component 501 is assumed to have one corner thereof formed with an angle configuration that identifies component 501 such that the appropriate terminals which are numbered and interconnected with circuitry of the component may be aligned with corresponding mounting pads of the circuit board when the component angle configuration is properly positioned on a circuit board. It is also assumed for the present embodiment of the invention that component 501 comprises a large number of logic circuits, such as resistor and capacitor arrays and combinations of AND, OR gates and similar type of elements, or microprocessors and memories, that must be specifically configured and programmed for various types of circuit structure operation. Thus, circuit board 60 may require one type of configuration for component 501 where only certain ones of the resistors and capacitors are required and the circuit structure design does not require AND or OR gates. The circuit structure utilizing circuit board 61 may require a configuration of component 501 having various AND and OR gates but does not require resistors or capacitors. A circuit structure utilizing circuit board 62 may require various combinations of resistors, capacitors, AND and OR, gates, microprocessors and memories provided by component 501. Similarly, circuit board 63 may require a totally different configuration of resistors, capacitors, AND and OR gates than circuit boards 60, 61 and 62.

Component 511, in contrast to component 501, is assumed to have a generally square configuration wherein terminals intended for use in surface mounting component 511 on a circuit board are embodied along bottom edges of component 511. Component 511 is assumed to have one corner thereof formed with a downward extending projection configuration identifying the configuration of component 511 such that the terminals thereof may be aligned with corresponding mounting pads of the circuit board when the component projection is properly positioned on a circuit board. It is also assumed for the present embodiment of the invention that component 501 comprises a microprocessor that must be specifically programmed with subsets of firmware program instructions defining operation of the circuit structures. Circuit board 60 may require one set of firmware program instructions which are different from the set of firmware instructions required by the circuit structures embodying circuit boards 61, 62 and 63, each of which may require different sets of firmware instructions for component 511 than those required by circuit board 60.

Component 522 differs from component 511 in that it is assumed to have a generally rectangular shape that would appear to be similar to component 501. However, component 522 has an indent at one end thereof that distinguishes component 522 from component 501 and is intended to be engaged with a corresponding circuit board projection thereby enabling the component terminals to be aligned with corresponding mounting pads of the receiving circuit board. It is assumed in the present embodiment of the invention that component 522 comprises a microprocessor that must be specifically programmed with subsets of firmware program instructions defining operation of the circuit structures and with combinations of resistors, capacitors, AND and OR gates. Each circuit board 60, 61, 62 and 63 may require different sets of firmware instructions and configurations of the resistors, capacitors, AND and OR gates required by the circuit structures embodying the circuit boards.

It is to be understood that the above described components are merely illustrious of a wide variety of components that may be used with the present invention and which may have different physical figures, configurations of circuit elements and require different sets of firmware programs instructions than components 501, 511 and 522.

Components 501, 511 and 522 may be stored in storage 5, such as in storage devices 50, 51 and 52, magazine, drawers, shelves, reels or various combinations of different types of storage devices. The apparatus of applicants' invention also has alignment apparatus 4 having a plurality of apertures 40, 41 and 42 each constructed to receive ones of components 501, 511 and 522 and position each received component in alignment with a circuit board mounting location defined by program instruction set 100, FIG. 2, controlling the operation of control processor 1, FIG. 1. Alignment apparatus 4 is arranged such that a received component, such as component 511, is inserted in an aperture 41 which is constructed to receive component 511 and position received component 511 in alignment with a mounting location on circuit boards 60 through 63. Similarly, components 501 and 522 inserted into alignment apparatus 4, apertures 40 and 42, respectively, are aligned by apertures 40 and 42 to correspond with mounting locations on circuit boards 60 through 63.

Figure 2:
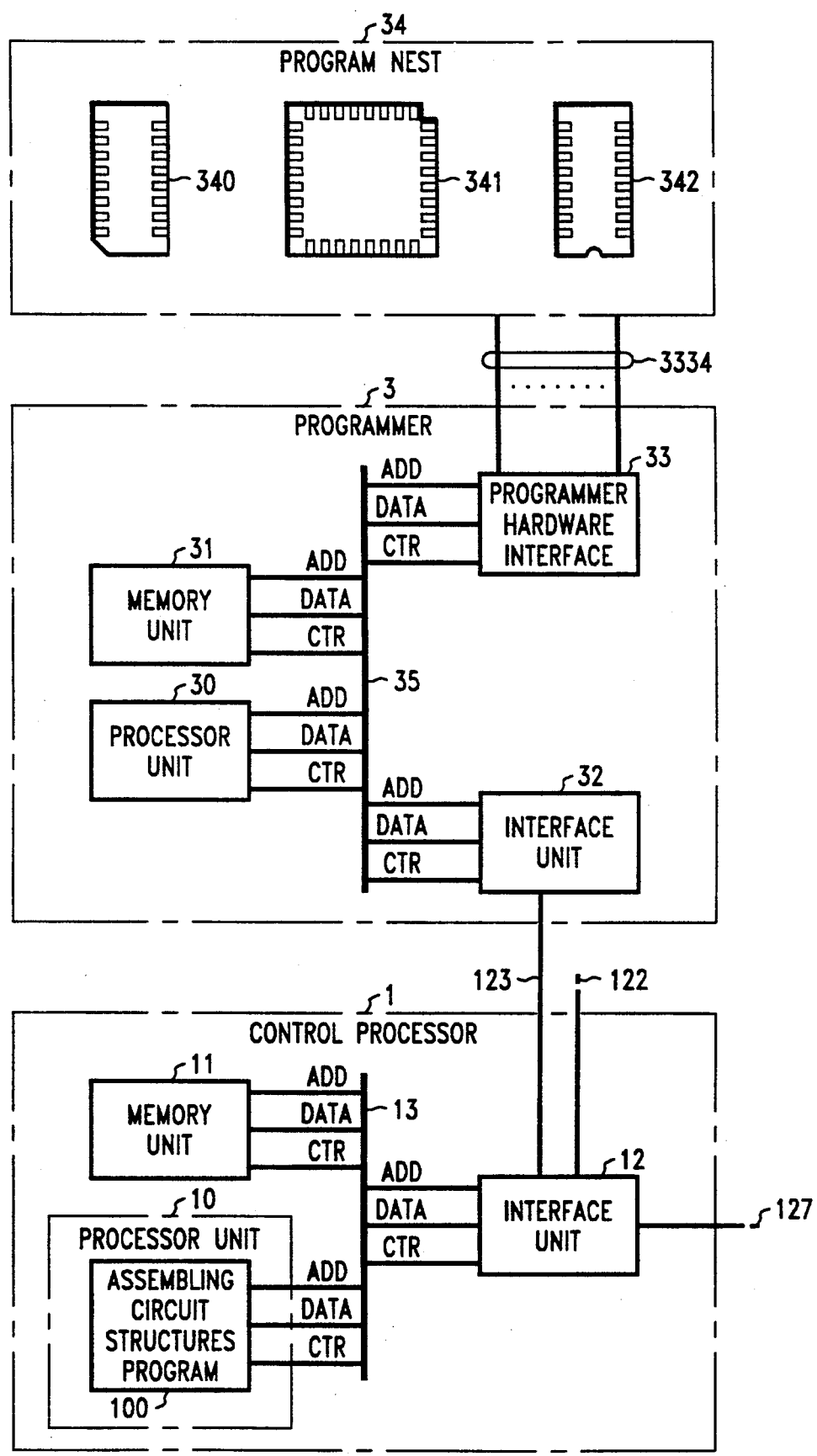
FIG. 2 illustrates a general configuration of control processor 1 and configuring and programming apparatus 3 set forth in FIG. 1 of the drawing, FIG. 3 sets forth illustrative programs and processes used with control processor 1 and configuring and programming apparatus 3 set forth in FIGS. 1 and 2 to control the apparatus of FIG. 1 to assemble circuit structures in accordance with the principles of the invention.
Figure 3:
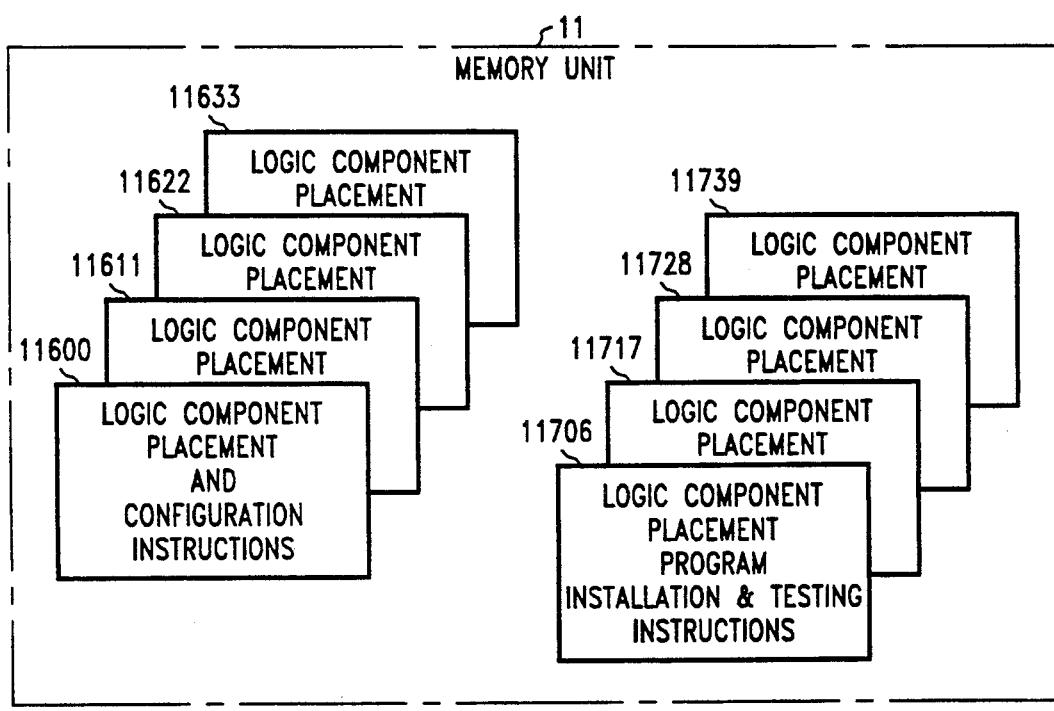

Applicants' apparatus for assembling circuit structures in real-time includes configuring and programming apparatus 3 that is intended for selectively receiving ones of components 501, 511 and 522 and electrically configuring the received components to conform to specific physical configurations in accordance with configuration subsets 116XX, FIG. 3, of program instruction set 100. In addition to physically configuring ones of components 501, 511 and 522, configuring and programming apparatus 3 also is arranged for selectively receiving others of aligned components 501, 511 and 522 and electrically programming the received components in accordance with programming subsets 117XX, FIG. 3, with firmware program instructions defining operation of the programmed components in the circuit structures. In operation, FIG. 1, control processor 1, operating in accordance with program instruction set 100, FIG. 2, downloads the appropriate one of subsets 116XX and 117XX into configuring and programming apparatus 3. Configuring and programming apparatus 3 responds to programming subsets 117XX by applying signals to terminals of cavities 340, 341 and 342 which operate to electrically program an aligned component in accordance with programming subsets of firmware program instructions defining operation of the component within a circuit structure.

Configuring and programming apparatus 3, FIG. 2, may consist of a computer and may be any one of a number of different types of computers, such as an AT&T 3B2-400 and 3B2-310 or 386 computer, or any one of a number of well known processor chips. Such computers need not be described in detail for an understanding of the invention and in general have a processor unit 30, memory unit 31 and an interface unit 32 each connected by address, data and control lead to a bus 35. Interface unit 32, coupled by data link 123 extending to control processor 1, is coupled with bus 35 so that data may be exchanged between processor unit 30 and control processor 1. Programmer hardware interface 33, connected to bus 35, has a number of control leads 3334 which extend to program nest 34 and which are connected with terminals of cavities 340, 341, 342. In operation, configuration and programming subsets of program instructions 116XX, 117XX, FIG. 3, are downloaded, FIG. 2, from control processor 1 over data link 123 and through interface unit 32 and over bus 35 to memory unit 31. Processor unit 30 responds to the downloaded subsets 116XX, 117XX by controlling program hardware interface 33 to selectively apply electrical voltages to ones of control leads 3334 connected with cavities 340, 341, 342 to both program and configure components 501, 511, 522 which have been inserted into cavities 340, 341, 342 in accordance with downloaded subsets 116XX and 117XX.

The circuit structure assembly apparatus also includes robotic structure 2, FIG. 1, connected by control link 122 with control processor 1 and controlled by program instruction set 100, operating within control processor 1. Robotic structure 2 selects components 501, 511, 522 from storage devices 50, 51, 52 and inserts each selected component in a predefined sequence in alignment apertures 40, 41, 42 and in configuring and programming apparatus 3. Each configured and programmed component 501, 511, 522 is selected by robotic structure 2 from configuring and programming apparatus 3 and is installed at a predefined mounting location on the appropriate circuit board 60, 61, 62 and 63. Many different types of robotic structures may be used within the embodiment of the invention. A typical robotic structure 2 may have a base 20 which can rotate in either direction in excess of 360 degrees with an upright member 21 which rotates at an angle with respect to base 20. Arm 22 is attached to and movable with relation to upright member 21 such that it may move upward and downward or in and out with respect to base 20 and upright member 21. Another arm 23 is provided with a holding member 24 arranged to grasp, hold and release one of components 501, 511 and 522 and is attached to arm 22 and rotates and moves at an angle with respect thereto.

Control processor 1, interconnected with robotic structure 2 and configuring and programming apparatus 3 by data links 122 and 123, respectively, controls robotic structure 2 and configuring and programming apparatus 3 to select components 501, 511, 522, align the selected components, electrically configure and program the aligned components and mount the configured and programmed components on circuit boards 60, 61, 62 and 63 to assemble circuit structures in accordance with program instruction set 100, FIG. 2, stored therein. Control processor 1 may be any one of a number of different types of computers, such as an AT&T 3B2-400 and 3B2-310, but is not limited thereto. Such computers need not be described in detail for an understanding of the invention and in general have a processor unit 10, memory unit 11 and an interface unit 12 each connected by address, data and control leads to a bus 13. Interface unit 12 couples data links 122, 123, 127 extending, respectively, FIG. 1, to robotic structure 2, configuring and programming apparatus 3 and computer terminal 7 with bus 13, FIG. 2, so that data may be exchanged with processor unit 10. Computer terminal 7, FIG. 1, which may be any of a number of well-known computer terminals or personal computers, is coupled to interface unit 12 by data link 127, FIG. 2, so that data may be entered into and read from processor unit 10 and memory unit 11. Computer terminal 7, FIG. 1, may also have, but not necessarily limited thereto, a processor unit 70, an input device, such as keyboard 72, and a display device similar to CRT terminal 71. Program instruction set 100 for controlling operation of the circuit structure assembling apparatus is normally resident in memory unit 11, FIG. 2, and is loaded into processor unit 10 to control operation of the apparatus. In one illustrious embodiment of the invention, configuration and programming subsets of program instructions, FIG. 3, 116XX and 117XX may be included within program instruction set 100, FIG. 2, and downloaded from control processor 1, FIG. 1, over data link 123 to control configuring and programming apparatus 3 to configure and program a component inserted within cavities 340, 341, 342 during the circuit structure assembly process. In yet another embodiment of the invention, configuration and programming instructions subsets 116XX and 117XX, FIG. 3, may be resident in memory unit 31, FIG. 2, of configuring and programming apparatus 3. When a selected and aligned component 501, 511 and 522 is loaded into configuring and programming apparatus 3, instructions are transmitted thereto from control processor 1, FIG. 1, over data link 123 to enable the appropriate configuration and programming subset to be loaded from memory unit 31, FIG. 2, into processor unit 30 to control programmer hardware interface 33 to configure and program a component received by cavities 340, 341 and 342 of program nest 34.

In operation, control processor 1, operating in accordance with the set of program instruction set 100, FIG. 2, assembles circuit structures, FIG. 1, by selecting, configuring, programming and installing components 501, 511, 522 on circuit boards 60, 61, 62 and 63. Upon completion, each circuit board mounting ones of the configured and programmed components interconnected by electrical conducting paths, such as paths 601, 631, operates as a circuit structure in accordance with program instruction set 100, FIG. 2. In assembly, control processor 1, operating in accordance with program instruction set 100, selects the circuit structure, FIG. 4, steps 10000, 10001, that is to be assembled using a circuit board, FIG. 1, such as circuit board 62. Assembly line apparatus 6 moves forward such that the circuit structure assembly apparatus receives and holds a circuit board, such as circuit board 62, while mounting components thereon during assembly of the circuit structure. Control processor 1 directs robotic structure 2 by transmitting instructions over data link 122, FIG. 4, step 10002, to select a component, for example component 501, in response to program instruction set 100 in a predefined sequence from component storage device 50. Robotic structure 2 grasps component 501 and moves under control of control processor 1, FIG. 4, step 10003, to align selected component 501 to correspond with an orientation defined by program instruction set 100 required to mount component 501 at a specific location on circuit board 62, FIG. 1.

Control processor 1 directs robotic structure 2 to align component 501 by inserting component 501 in aperture 40 of aligning apparatus 4 which is constructed to receive one of components 501, 511, 522 and position each received component in alignment with the circuit board mounting location defined by program instruction set 100. After aligning component 501, control processor 1 determines in accordance with program instruction set 100, FIG. 4, step 10004, whether component 501 is to be physically configured or programmed with a set of firmware instructions or the combination thereof. When it is determined that component 501 is to be configured, or to be configured prior to programming, program instruction set 100, FIG. 5, step 1160000, downloads the appropriate logic component placement and configuration instruction subset, such as configuration subset 11600, FIG. 3, into memory unit 31, FIG. 2, of configuring and programming apparatus 3, FIG. 1. Depending upon the particular type of circuit structure being assembled, a specific subset 11600, 11611, 11622 through 11633 is downloaded so that component 501 may physically be configured in accordance with the requirements of the circuit structure.

Figure 4:
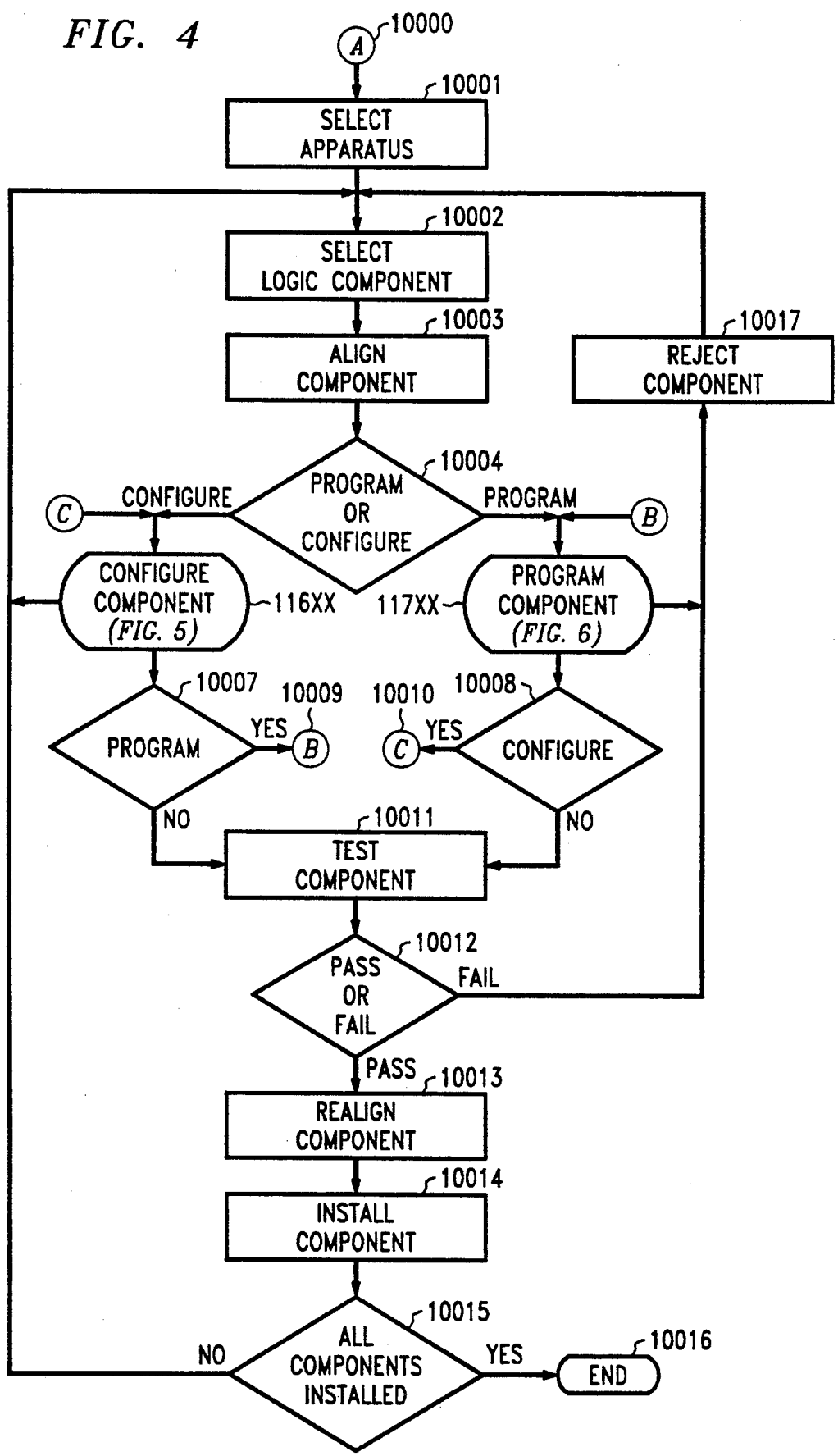
FIG. 4 illustrates a flow chart of the operation of control processor 1 in controlling the apparatus of FIG. 1 in assembling circuit structures.
Figure 5:
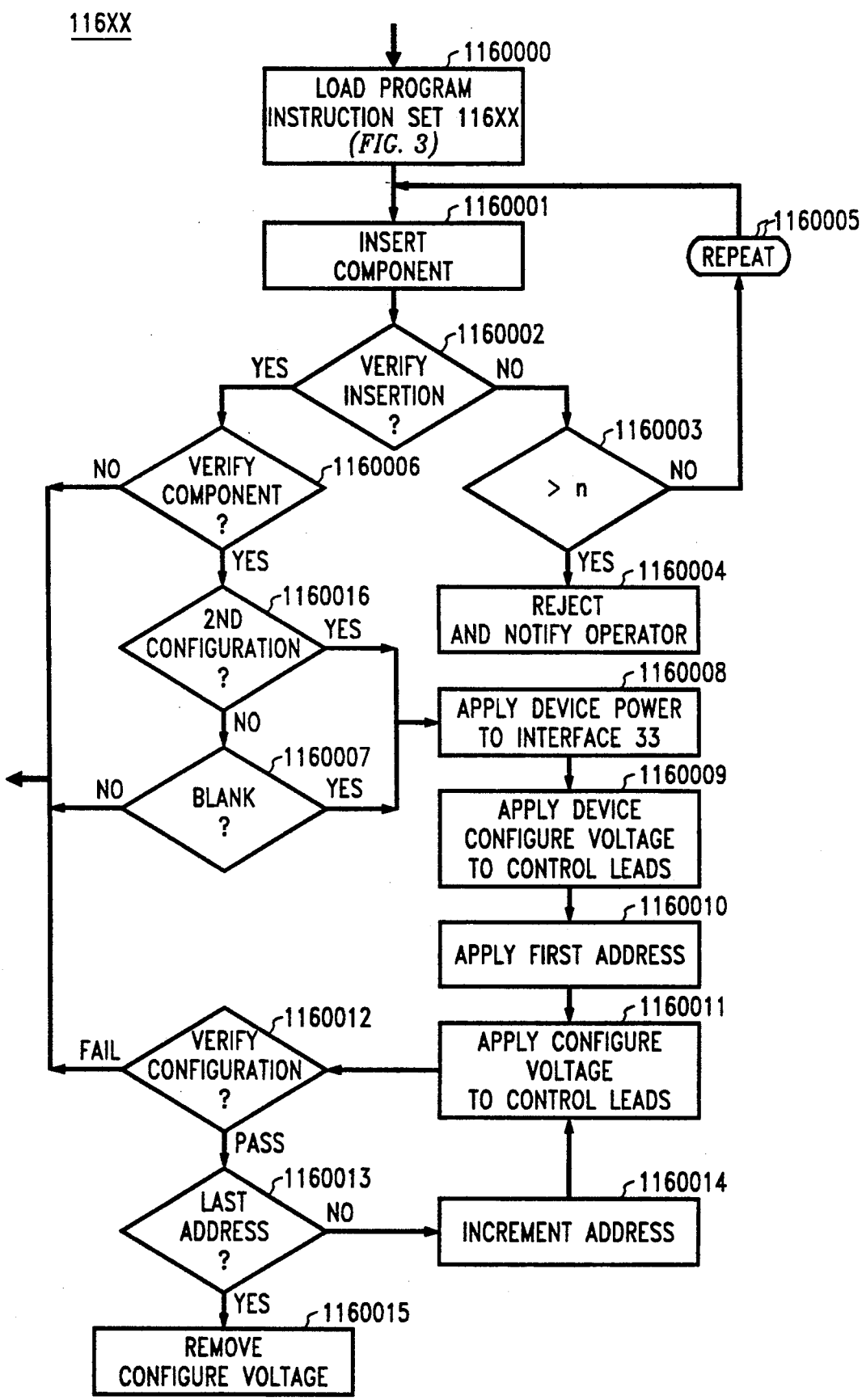
FIGS. 5 and 6 illustrate flow charts of the operation of control processor 1 and configuring and programming apparatus 3 in controlling the apparatus of FIG. 1 to configure and program components during the installation of the components onto circuit boards while assembling circuit structures in accordance with the principles of the invention.

Robotic structure 2, FIG. 1, is directed to remove component 501 from aligning apparatus 4 aperture 40 and insert aligned component 501 in cavity 340 of configuring and programming apparatus 3, FIG. 5, step 1160001. Processor unit 30, step 1160002, verifies the insertion of component 501 in cavity 340. If component 501 has not been or is improperly inserted within cavity 340, robotic structure 2 is directed to repeat the insertion process, steps 1160003, 1160005, for a predetermined number of n times. When component 501 cannot be inserted into cavity 340, component 501 is rejected, FIG. 5, step 1160004, and an operator located at computer terminal 7, FIG. 1, is notified via data links 123, 127 of the failure to insert component 501 in configuring and programming apparatus 3. When component 501 has been properly inserted into cavity 340, step 1160002, configuration subset 11600 verifies if inserted component 501 is the proper component, step 1160006. When it is determined that the component is the wrong type or has been previously improperly configured, configuring instruction subset 11600 notifies control processor 1 program instruction set 100, via data link 123, FIG. 4, to select another component 501.

After determining that a blank component 501 has been inserted into cavity 340, steps 1160016, 1160007, processor unit 30, FIG. 2, directs that power be applied to programmer hardware interface 33 and made available for application to the control leads 3334 extending to program nest 34, FIG. 5, steps 1160008, 1160009. Configuration subset 11600 controls processor unit 30 to initiate the component configure sequence by applying a first address, step 1160010, to bus 35, FIG. 2, to direct programmer hardware interface 33 to selectively apply configure voltages to control leads 3334, FIG. 5, step 1160011, to perform the initial physical configuration of component 501. The component configuration resulting from the first address is verified, step 1160012, and if the resulting configuration is correct, the configuration instruction subset 11600 determines if the last address of the subset has been applied to programmer hardware interface 33, step 1160013. If the configure sequence has not been completed, step 1160013, the current address is incremented, step 1160014, and steps 1160011 through 1160013 repeated until component 501 has been physically configured as required for use on circuit board 62 and in the circuit structure application. Control processor 1 is notified, step 1160012, via data link 123, by configuration subset 1600 when there is a failure to verify a configuration. Upon notification, FIG. 1, robotic structure 2 is controlled to reject the improperly configured component 501 by removing component 501 from cavity 340 of configuring and programming apparatus 3 and deposit the removed component 501 in a rejected location, not shown. Control processor 1 then directs robotic structure 2 to select another component 501 from storage device 50 and to repeat the configuring sequence starting with step 10002, FIG. 4, of program instruction set 100 and continuing in accordance with configuration subset 11600, FIG. 5. When component 501 has been verified as being configured in accordance with the last address of configuration subset 11600, steps 1160012, 1160013, the configure voltage, step 1160015, is removed by programmer hardware interface 33, FIG. 2, from leads 3334 extending to program nest 34.

Control is returned to program instruction set 100, FIG. 4, step 10007. In some circuit structure applications, it may be necessary to only configure a component. In another application, it may be necessary to first configure a component and then sequentially program the preconfigured component. In other applications, it may be necessary to first program a component and then sequentially configure a preprogrammed component. In still yet another application, it may only be necessary to program a component. In other applications, it may be necessary to repeat both configure and program sequences several times on a component to prepare the component for various circuit structure applications.

Figure 6:
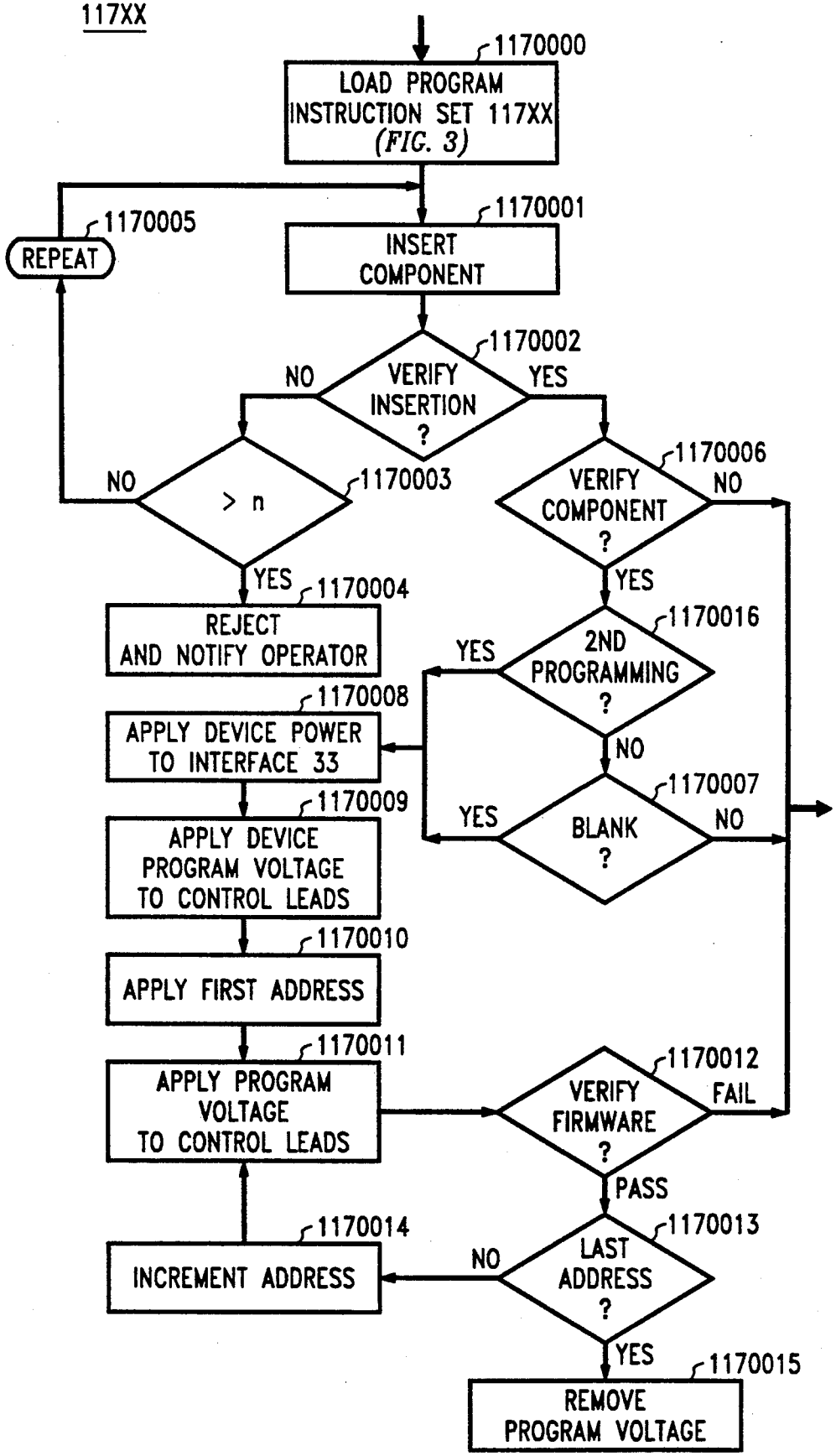

When it is determined that it is necessary to program a preconfigured component 501, FIG. 4, step 10007, instruction set 100 either downloads the appropriate programming subset 117XX, for example subset 11706, FIG. 3, over data link 123, FIG. 1, to configuring and programming apparatus 3 or directs configuring and programming apparatus 3 to load the programming subset 11706, FIG. 2, into processor unit 30. Processor unit 30, operating in accordance with loaded subset 11706, FIG. 6, step 1170000, insures that component 501 is inserted in cavity 340 of configuring and programming apparatus 3 and verifies the insertion, steps 1170001, 1170002. If component 501 has not been or is improperly inserted within cavity 340, robotic structure 2 may be directed to repeat the insertion process, steps 1170003, 1170005, for a predetermined number of n times. If component 501 is not or cannot be inserted in cavity 340, component 501 is rejected, FIG. 5, step 1170004, and the operator is notified of the insertion failure.

Upon verifying insertion, component type and determining that component 501 is either blank with respect to the application of firmware instructions or is again undergoing another programming steps 1170002, 1170006, 1170016, 1170007 power is applied to programmer hardware interface 33 and made available for application to the control leads 3334 extending to program nest 34, steps 117008, 1170009. Programming subset 11706 controls processor unit 30 to initiate the component programming sequence by applying a first address, step 1170010, to bus 35, FIG. 2, to direct programmer hardware interface 33 to selectively apply programming voltages to control leads 3334, FIG. 6, step 1170011, to perform the initial programming of component 501. The component firmware, installed in component 501 by the selectively application of the programming voltages to control leads 3334 by the first address, is verified, step 1170012, and if the component firmware passes the verification, step 1170012, programming subset 11706 determines if the last address of the subset has been applied to programmer hardware interface 33, step 1170013. The programming sequence is continued, steps 1170014, 1170011, 1170012 and 1170013, until component 501 has been programmed with the firmware required for operation in the specific circuit structure application. Control processor 1 is notified, step 1170012, via data link 123, by programming subset 11706 when there is a failure to verify a programming sequence. Upon notification, FIG. 1, robotic structure 2 is controlled to reject the improperly programmed component 501 by removing component 501 from cavity 340 of configuring and programming apparatus 3 and deposit the removed component 501 in a rejected component location, not shown. Control processor 1 then directs robotic structure 2 to select another component 501 from storage device 50 and to repeat the programming sequence starting with step 10002, FIG. 4, of program instruction set 100 and continuing in accordance with configuring and programming program instruction subsets 11600, 11706, or either as required, FIGS. 5 and 6.

When component 501 has been verified as being configured and programmed or configured or programmed in accordance with the last address of subset 11600, 11706, steps 1160012, 1160013 and 1170012, 1170013, the configuring and programming voltage, step 1160015, 1170015, is removed by programmer hardware interface 33, FIG. 2, from leads 3334 extending to program nest 34. Control is returned to program instruction set 100, FIG. 4, steps 10007, 10008 whichever is applicable. If configured or programmed or configured and programmed, component 501 does not require additional configuration or programming, steps 10007, 10008, component 501 is tested for the specific circuit structure application, step 10011. This may be accomplished by downloading the appropriate test programming sequence from control processor 1 to configuring and programming apparatus 3 which is then enabled to test configured and programmed component 501. In another embodiment, not shown but within the teaching of the invention, robotic structure 2 may be controlled by control processor 1 to remove component 501 from configuring and programming apparatus 3 and insert it into a test facility which is then controlled by control processor 1 to perform the appropriate test sequence, step 10011.

If the configured and programmed component 501 fails the test sequence, step 10012, the component is rejected, step 10017, and another component 501 is selected, step 10002, and the assembling procedure repeated for the new component 501. After passing the test sequence, step 10012, control processor 1, FIG. 1, controls robotic structure 2 to remove the configured and programmed component 501 from cavity 340 and check the alignment of component 501 by inserting the removed component 501 in aligning apparatus 4, FIG. 4, step 10013. After component 501 has been realigned, control processor 1, operating in accordance with program instruction set 100, directs robotic structure 2 to remove the realigned component 501 from alignment apparatus 4 and install component 501 at the appropriate mounting location on circuit board 62, FIG. 4, step 10014. If all components have not been installed, step 10015, control processor 1 directs robotic structure 2 to select another component 501, 511, 522, step 10002, and repeat the circuit structure assembling process until all components required by the circuit structure have been installed, step 10015, at which time the process is repeated for other circuit structures, step 10016.

The circuit structure assembling process is continued by programming, configuring and selectively installing the programmed and configured components in realtime at the predefined locations on the circuit boards until the circuit structures have been assembled in accordance with program instruction set 100. In assembly, several functions may be performed in the same interval of time. For example, one component 511 may be in the process of being configured by configuring and programming apparatus 3 while another component 522 is being selected by robotic structure 2 from component storage 52 and inserted in aligning apparatus 4. After inserting component 522 in aligning apparatus 4, robotic structure 2 may install component 511 on circuit board 62 while component 522 is still being configured or programmed. In addition, robotic structure 2 may have multiple robots coupled with and operating under control of control processor 1.

We claim:

1. A method for assembling circuit structures in a continuous assembly process wherein said circuit structure assembling method comprises the steps of selecting components in response to a set of program instructions in a predefined sequence from a plurality of components and aligning each selected component to correspond with an orientation defined by the program instruction set required to mount the selected component at a specific location on circuit boards, and electrically programming and configuring each selected and aligned component in accordance with subsets of the program instruction set and installing each programmed and configured component at predefined locations on the circuit boards.

2. The circuit assembling method set forth in claim 1 comprising the step of receiving and holding a circuit board while mounting components thereon during assembly of a circuit structure.

3. The circuit assembling method set forth in claim 2 wherein said selecting and aligning receiving step comprises the step of inserting the selected components in ones of a plurality of apertures each constructed to receive one of the selected components and position each received component in alignment with a mounting location defined by the program instruction set on the circuit board.

4. The circuit structure assembling method set forth in claim 3 wherein said programming, configuring and installing step comprises the step of selectively receiving ones of said aligned components and electrically programming the received components with programming subsets of firmware program instructions defining operation of the circuit structures wherein said programming subsets are selected from the program instruction set.

5. The circuit structure assembling method set forth in claim 4 wherein said programming, configuring and installing step comprises the step of selectively receiving others of said aligned components and electrically configuring said received other components to conform to specific physical configurations in accordance with configured subsets of the program instruction set.

6. The circuit structure assembling method set forth in claim 5 wherein said programming, configuring and installing step comprises the step of selectively installing said electrically programmed and configured components at the predefined locations on the circuit boards to assemble the circuit structures in accordance with the program instruction set.

7. The circuit structure assembling method set forth in claim 6 wherein said selecting and aligning step comprises the step of controlling selection of the components from a component storage apparatus and said inserting, selectively receiving and electrically programming and configuring and selectively installing steps in a predefined sequence in accordance with said program instruction set to configure, program and assemble the circuit structures to conform with the program instruction set and subsets thereof.

8. A method for assembling circuit structures in a continuous assembly process wherein said circuit structure assembling method comprises the steps of receiving and holding a circuit board while mounting components thereon during assembly of a circuit structure, inserting selected components in ones of a plurality of apertures each constructed to receive one of the selected components and position each received component in alignment with a mounting location defined by a program instruction set on the circuit board, receiving ones of said aligned components and electrically programming the received components in accordance with subsets of program instructions defining operation of the circuit structures wherein said program subsets are selected from the program instruction set, receiving others of said aligned components and electrically configuring said received other components to conform to specific physical configurations in accordance with configuring subsets of the program instruction set, installing said electrically programmed and configured components at the predefined locations on the circuit boards, and controlling selection of the components from component storage apparatus and said inserting, receiving and electrically programming and configuring and installing steps in a predefined sequence in accordance with the program instruction set to configure, program and assemble the circuit structures in real-time to conform with the program instruction set and configuring and programming subsets thereof.

9. Apparatus for assembling circuit structures in a continuous assembly process comprising a processor responsive to a set of program instructions for controlling a robotic structure to select components from storage devices and aligning each selected component to correspond with an orientation required to mount the selected component at a specific location on circuit boards and for selectively configuring and programming each selected and aligned component in accordance with subsets of the program instructions and installing each configured and programmed component at predefined locations on the circuit boards to configure, program and assemble the circuit structures in real-time to conform with said program instruction set and subsets thereof.

10. Apparatus for assembling circuit structures in a continuous assembly process comprising means responsive to a set of program instructions for selecting components from a plurality of components and aligning each selected component to correspond with an orientation defined by said program instruction set required to mount the selected component at a specific location on a circuit board, and means controlled by said program instruction set for electrically configuring and programming each selected and aligned component in accordance with subsets of the program instruction set and installing each configured component at predefined locations on the circuit board.

11. The assembly apparatus set forth in claim 10 wherein said circuit structure assembling apparatus comprises means for receiving and holding the circuit board to enable said configuring, programming and installing means to selectively mount components thereon during assembly of a circuit structure.

12. The assembly apparatus set forth in claim 11 wherein said circuit structure assembling apparatus comprises storage devices each configured for storing ones of said components to be selected by said selecting and aligning means for mounting on the held circuit board.

13. The assembly apparatus set forth in claim 12 wherein said selecting and aligning means comprises means having a plurality of apertures each constructed to receive one of said components selected from said storage devices and position each received component in alignment with a mounting location defined by the program instruction set on the circuit board.

14. The assembly apparatus set forth in claim 12 wherein said electrically configuring, programming and installing means comprises means for electrically configuring said one received component to conform to specific physical configurations in accordance with configuring subsets of said program instruction set.

15. The assembly apparatus set forth in claim 14 wherein said electrically configuring, programming and installing means comprises means for electrically programming other ones of said received components with programming subsets of firmware program instructions defining operation of the other components in the circuit structures wherein said programming subsets are selected from the program instruction set.

16. The assembly apparatus set forth in claim 15 wherein said electrically configuring, programming and installing means comprises means controlled by said program instruction set for selecting ones of said components from said storage devices and inserting each selected component in a predefined sequence in said alignment apertures and in said electrically configuring and programming means and for installing each configured and programmed component at the circuit board predefined mounting location.

17. The assembly apparatus set forth in claim 16 wherein said assembly apparatus comprises means interconnected with said selecting and inserting means and with said selectively receiving and electrically configuring and programming means for controlling said selecting and inserting means and said selectively receiving and electrically configuring and programming means to assemble each one of said circuit structures in accordance with the program instruction set stored therein.

18. Apparatus for assembling circuit structures in real-time on a continuous assembly line comprising receiving means for receiving and holding a circuit board while mounting components thereon during assembly of a circuit structure, storage means configured for storing said components to be mounted on the held circuit board, aligning means having a plurality of apertures each constructed to receive ones of said components from said storage means and for aligning each received component to correspond with a mounting location predefined by a program instruction set and positioned on the held circuit board, means for selectively receiving ones of said components aligned by said aligning means and electrically programming and configuring said received components with specific firmware instructions and physical configurations in accordance with configuring and programming subsets of said program instruction set, selecting means controlled by said program instruction set for selecting ones of said components from said storage means and inserting each selected component in a predefined sequence in said alignment apertures and in said selectively receiving and electrically programming and configuring means and installing each programmed and configured component at the predefined circuit board mounting location, and means interconnected with said selecting means and with said programming means for controlling said selecting and configuring and programming means to select ones of the components from said storage means and insert said selected components in said aligning means to electrically program and configure said aligned components in said configuring and programming means and installing each aligned, programmed and configured component in the predefined circuit board mounting location to assemble each one of said circuit structures in accordance with said program instruction set stored therein.

19. The circuit structure assembling apparatus set forth in claim 12 wherein said programming means comprises means responsive to said program instruction set for electrically configuring ones of said received components to conform to specific physical configurations in accordance with configuring subsets of said program instruction set and for electrically programming other ones of said received components in accordance with programming subsets defining operation of the circuit structures wherein said configuring and programming subsets are selected from said program instruction set.

* * * * *